United States Patent
Qin et al.

(10) Patent No.: US 12,254,941 B2
(45) Date of Patent: Mar. 18, 2025

(54) TEST CIRCUIT, TEST METHOD AND MEMORY

(71) Applicant: CHANGXIN MEMORY TECHNOLOGIES, INC., Hefei (CN)

(72) Inventors: Jianyong Qin, Hefei (CN); Jianni Li, Hefei (CN); Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 272 days.

(21) Appl. No.: 17/955,658

(22) Filed: Sep. 29, 2022

(65) Prior Publication Data
US 2023/0021184 A1   Jan. 19, 2023

Related U.S. Application Data

(63) Continuation of application No. PCT/CN2022/093712, filed on May 19, 2022.

(30) Foreign Application Priority Data

Apr. 26, 2022   (CN) .................. 202210451906.X

(51) Int. Cl.
*G11C 29/46*   (2006.01)
*G06F 1/04*   (2006.01)
(Continued)

(52) U.S. Cl.
CPC ............. *G11C 29/46* (2013.01); *G06F 1/04* (2013.01); *G06F 13/1689* (2013.01);
(Continued)

(58) Field of Classification Search
CPC ............ G11C 29/46; G11C 29/12005; G11C 29/1201; G11C 29/12015; G11C 29/023;
(Continued)

(56) References Cited

U.S. PATENT DOCUMENTS

| | | |
|---|---|---|
| 6,671,652 B2 | 12/2003 | Watson, Jr. |
| 6,721,114 B1 | 4/2004 | Sutardja |
| | (Continued) | |

FOREIGN PATENT DOCUMENTS

| | | |
|---|---|---|
| CN | 1416215 A | 5/2003 |
| CN | 1677820 A | 10/2005 |
| | (Continued) | |

OTHER PUBLICATIONS

JEDEC JESD209-4B, Low Power Double Data Rate 4 (LPDDR4), JEDEC Solid State Technology Association, Feb. 2017, 307 pages.
(Continued)

*Primary Examiner* — Metasebia T Retebo
(74) *Attorney, Agent, or Firm* — Syncoda LLC; Feng Ma

(57) ABSTRACT

A test circuit includes first integration circuit configured to receive first test signal and integrate first test signal to output first integrated signal; second integration circuit configured to receive second test signal and integrate second test signal to output second integrated signal, where first test signal and second test signal are signals inverted with respect to each other, value of first integrated signal is product of duty cycle of first test signal and a voltage amplitude of power supply, and value of second integrated signal is product of duty cycle of second test signal and voltage amplitude of power supply; and comparison circuit connected to first and second integration circuits. The comparison circuit is configured to output high-level signal in response to first integrated signal being greater than second integrated signal, and output low-level signal in response to second integrated signal being greater than first integrated signal.

15 Claims, 9 Drawing Sheets

(51) Int. Cl.
*G06F 13/16* (2006.01)
*G11C 29/12* (2006.01)

(52) U.S. Cl.
CPC .... *G11C 29/12005* (2013.01); *G11C 29/1201* (2013.01); *G11C 29/12015* (2013.01)

(58) Field of Classification Search
CPC .. G11C 29/50012; G06F 1/04; G06F 13/1689
See application file for complete search history.

(56) References Cited

U.S. PATENT DOCUMENTS

| | | |
|---|---|---|
| 6,927,641 B2 | 8/2005 | Terasawa |
| 7,567,118 B2 | 7/2009 | Azuma |
| 9,448,274 B2 | 9/2016 | Pounds |
| 10,164,572 B2 | 12/2018 | Chen |
| 10,885,989 B1 | 1/2021 | Moon |
| 11,005,479 B2 | 5/2021 | Im |
| 11,349,457 B2 | 5/2022 | Kim |
| 11,496,136 B1 | 11/2022 | Park |
| 2003/0020529 A1 | 1/2003 | Nakanishi |
| 2003/0098749 A1 | 5/2003 | Terasawa |
| 2003/0219089 A1 | 11/2003 | Ho |
| 2005/0094448 A1 | 5/2005 | Lee |
| 2005/0218966 A1 | 10/2005 | Azuma |
| 2007/0223638 A1 | 9/2007 | Okamura |
| 2007/0271068 A1 | 11/2007 | Boerstler et al. |
| 2008/0005606 A1 | 1/2008 | Koo |
| 2010/0219870 A1 | 9/2010 | Kikuchi |
| 2011/0156757 A1 | 6/2011 | Hayashi |
| 2011/0181308 A1 | 7/2011 | Ishida |
| 2015/0301104 A1 | 10/2015 | Pounds et al. |
| 2017/0222796 A1 | 8/2017 | Chen et al. |
| 2018/0054163 A1 | 2/2018 | Chen et al. |
| 2019/0181847 A1 | 6/2019 | Satoh et al. |
| 2020/0336148 A1 | 10/2020 | Im et al. |
| 2022/0094339 A1 | 3/2022 | Kim et al. |
| 2022/0130439 A1 | 4/2022 | Tian et al. |
| 2022/0247390 A1 | 8/2022 | Kim et al. |

FOREIGN PATENT DOCUMENTS

| | | | |
|---|---|---|---|
| CN | 101826860 | A | 9/2010 |
| CN | 101410719 | B | 1/2012 |
| CN | 102638247 | A | 8/2012 |
| CN | 103840796 | A | 6/2014 |
| CN | 103997317 | A | 8/2014 |
| CN | 104753524 | A | 7/2015 |
| CN | 106233150 | A | 12/2016 |
| CN | 107153138 | A | 9/2017 |
| CN | 109274356 | A | 1/2019 |
| CN | 209087409 | U | 7/2019 |
| CN | 111161771 | A | 5/2020 |
| CN | 111193498 | A | 5/2020 |
| CN | 210899108 | U | 6/2020 |
| CN | 111835349 | A | 10/2020 |
| CN | 111863048 | A | 10/2020 |
| CN | 112420113 | A | 2/2021 |
| CN | 113346739 | A | 9/2021 |
| CN | 113764028 | A | 12/2021 |
| CN | 215773547 | U * | 2/2022 |
| CN | 114257235 | A | 3/2022 |
| CN | 114420187 | A | 4/2022 |
| EP | 3886099 | A1 | 9/2021 |
| WO | 2015037252 | A1 | 3/2015 |

OTHER PUBLICATIONS

JEDEC JESD209-5B, Low Power Double Data Rate 5 (LPDDR5), JEDEC Solid State Technology Association, Jun. 2021, 552 pages.
Kyu-hyoun kim, A 20-GB/s 256-Mb DRAM with an Inductorless Quadrature PLL and a Cascaded Pre-emphasis Transmitter, JSSC, Jan. 2006, 8 pages.
Non-Final Office Action of the U.S. Appl. No. 17/866,682, issued on Jan. 17, 2023, 9 pgs.

* cited by examiner

TEST CIRCUIT, TEST METHOD AND MEMORY

CROSS-REFERENCE TO RELATED APPLICATIONS

This application is a continuation of International Application No. PCT/CN2022/093712, filed on May 19, 2022, which claims priority to Chinese Patent Application No. 202210451906.X, filed on Apr. 26, 2022. The disclosures of International Application No. PCT/CN2022/093712 and Chinese Patent Application No. 202210451906.X are hereby incorporated by reference in their entireties.

BACKGROUND

With the progress of technology, high-tech products are constantly updated, and the performance of high-tech products is constantly improving. The work of high-tech products cannot be separated from the storage of data in a memory. Therefore, the improvement of the data access rate and data access stability of the memory is an urgent problem to be solved.

A clock signal is always used by the memory for data processing, and the transmission frequency of the clock signal determines a number of operations performed by the memory in a same period of time, that is to say, determines the speed of data processing by the memory. In other words, the memory processes data based on high-speed clock signals, which is of great significance to improve the performance of the memory.

How to test whether the duty cycle of high-speed clock signal meets a requirement, how to ensure the accuracy in testing the high-speed clock signal and how to generate equidistant and parallel clock signals based on high-speed clock signals are urgent problems to be solved at present.

SUMMARY

The disclosure relates to the field of semiconductor circuit design, and in particular to a test circuit, a test method and a memory.

The embodiments of the present disclosure provide a test circuit for testing a duty cycle of a signal. The circuit includes: a first integration circuit configured to receive a first test signal and integrate the first test signal to output a first integrated signal; a second integration circuit configured to receive a second test signal and integrate the second test signal to output a second integrated signal, where the first test signal and the second test signal are signals inverted with respect to each other, a value of the first integrated signal is a product of a duty cycle of the first test signal and a voltage amplitude of a power supply, and a value of the second integrated signal is a product of a duty cycle of the second test signal and the voltage amplitude of the power supply; and a comparison circuit having one input terminal connected to the first integration circuit, and the other input terminal connected to the second integration circuit. The comparison circuit is configured to compare a voltage value of the first integrated signal and a voltage value of the second integrated signal, output a high-level signal in response to the first integrated signal being greater than the second integrated signal, and output a low-level signal in response to the second integrated signal being greater than the first integrated signal.

The embodiments of the disclosure also provide a test method applied to the test circuit provided by the above embodiment. The test method includes: acquiring a first test signal and a second test signal, where the first test signal and the second test signal are signals inverted with respect to each other; integrating the first test signal based on a first integration circuit to acquire a first integrated signal, and integrating the second test signal based on a second integration circuit to acquire a second integrated signal, a value of the first integrated signal is a product of a duty cycle of the first test signal and a voltage amplitude of a power supply, and a value of the second integrated signal is a product of a duty cycle of the second test signal and the voltage amplitude of the power supply; and comparing, based on a comparison circuit, the voltage value of the first integrated signal with the voltage value of the second integrated signal, and determining the duty cycle of the first test signal based on an indication signal generated by the comparison circuit, where in response to the indication signal being at a high level, the duty cycle of the first test signal is greater than 50%, and in response to the indication signal being at a low level, the duty cycle of the first test signal is not greater than 50%.

BRIEF DESCRIPTION OF THE DRAWINGS

One or more embodiments are exemplarily illustrated by the corresponding drawings. These exemplary descriptions do not limit the embodiments. Unless otherwise stated, the pictures in the drawings do not limit the scale. In order to describe the technical solutions of the embodiments of the present disclosure more clearly, drawings required to be used in the embodiments of the present disclosure will be briefly introduced below. Apparently, the drawings described below are only some embodiments of the present disclosure. Those of ordinary skill in the art also can obtain other drawings according to these drawings without doing creative work.

DETAILED DESCRIPTION

How to test whether the duty cycle of high-speed clock signal meets a requirement, how to ensure the accuracy in testing the high-speed clock signal and how to generate equidistant and parallel clock signals based on high-speed clock signals are urgent problems to be solved at present.

An embodiment of the present disclosure provides a test circuit to accurately test the duty cycle of an input signal.

Those of ordinary skill in the art will appreciate that numerous technical details have been presented in various embodiments of the present disclosure in order to enable the reader to better understand the present disclosure. However even without these technical details and various variations and modifications based on the following embodiments, the claimed technical solutions of the present disclosure may be implemented. The following divisions of the all embodiments are for convenience of description and should not be limited in any way to the specific implementation of the present disclosure. The respective embodiments may be combined with each other and referred to each other without contradiction.

Figure 1:
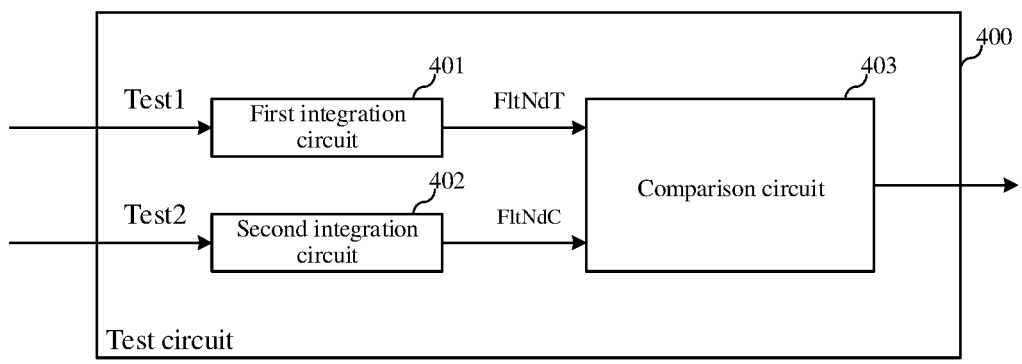
FIG. 1 is a schematic structural diagram of a test circuit according to an embodiment of the present disclosure.
Figure 2:
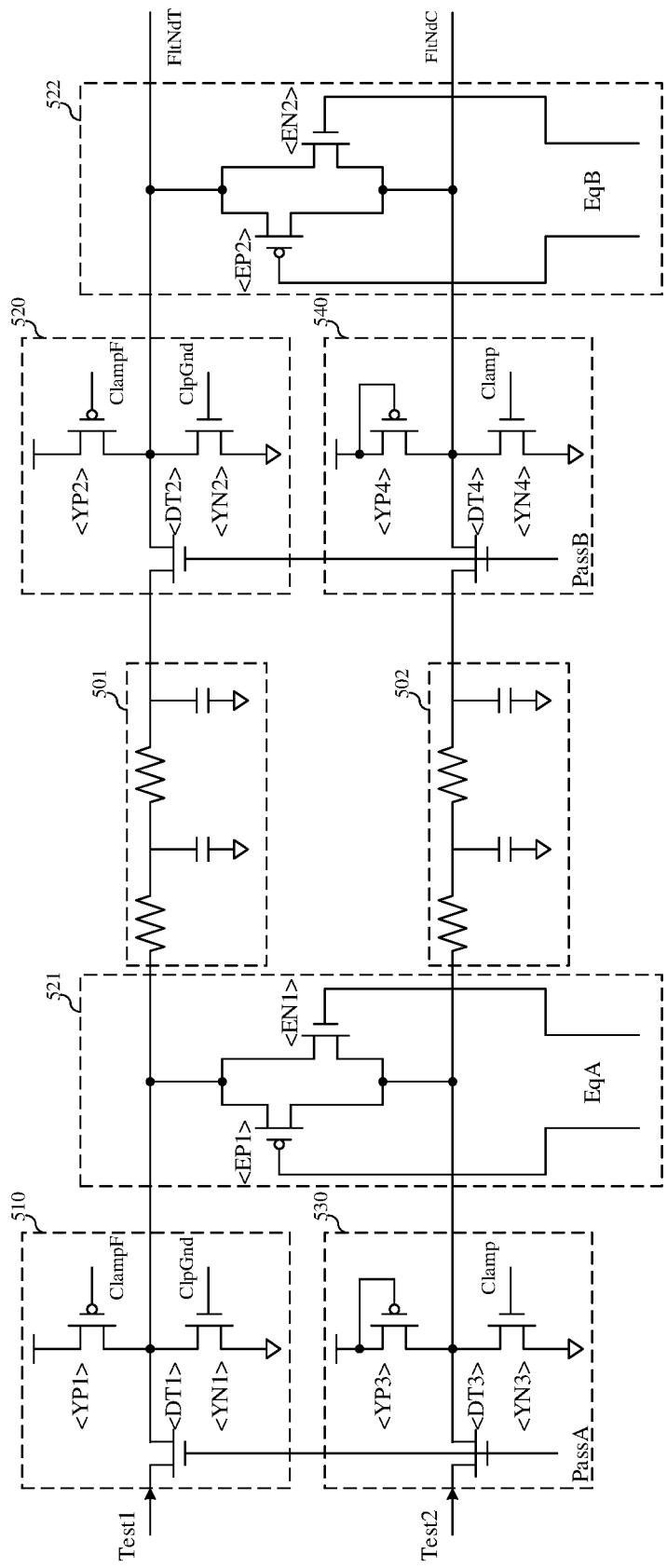
FIG. 2 is a schematic structural diagram of a first integration circuit and a second integration circuit according to an embodiment of the present disclosure.
Figure 3:
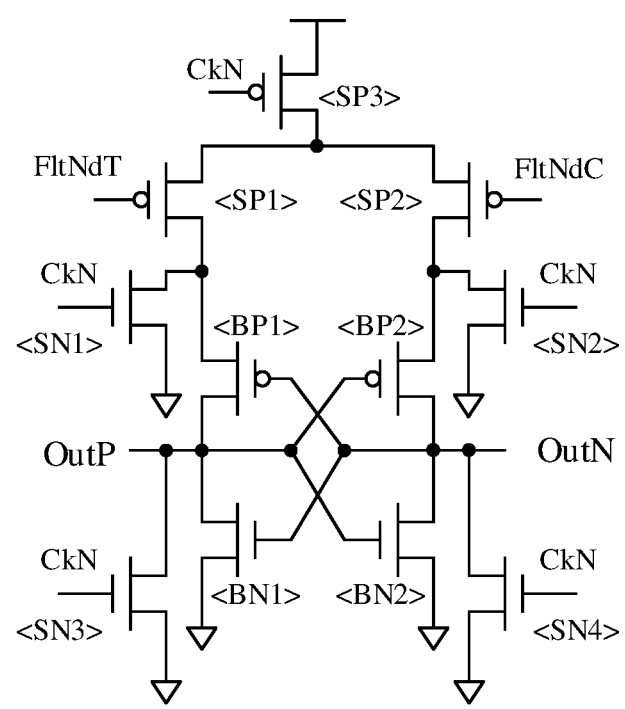
FIG. 3 is a schematic structural diagram of a comparison circuit according to an embodiment of the present disclosure.
Figure 4:
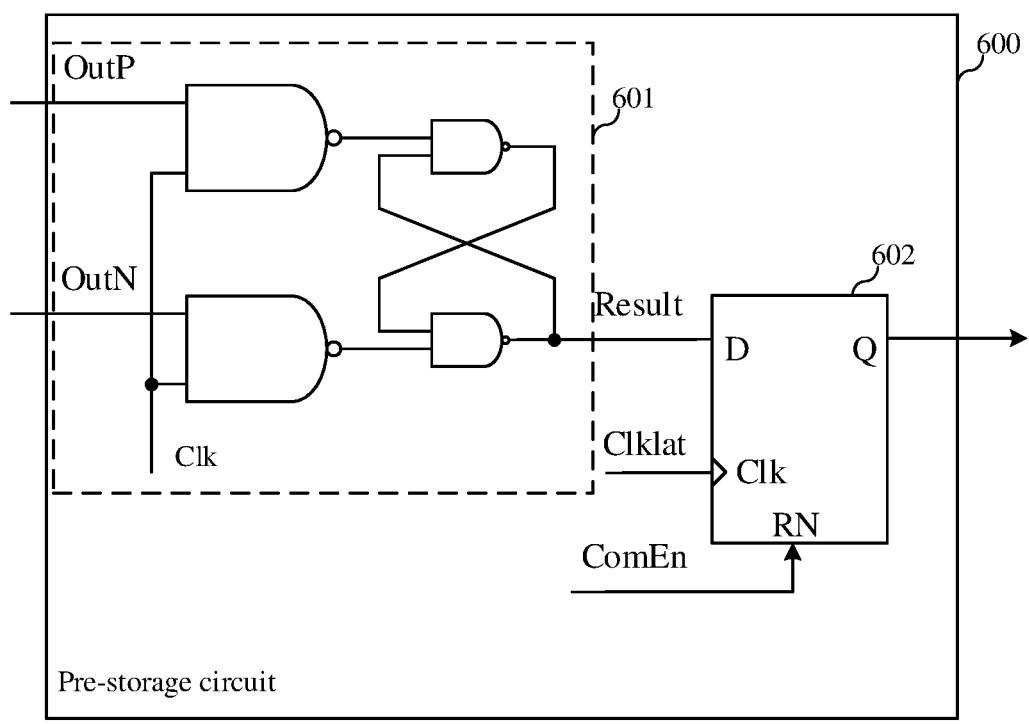
FIG. 4 is a schematic structural diagram of a pre-storage circuit according to an embodiment of the present disclosure.
Figure 5:
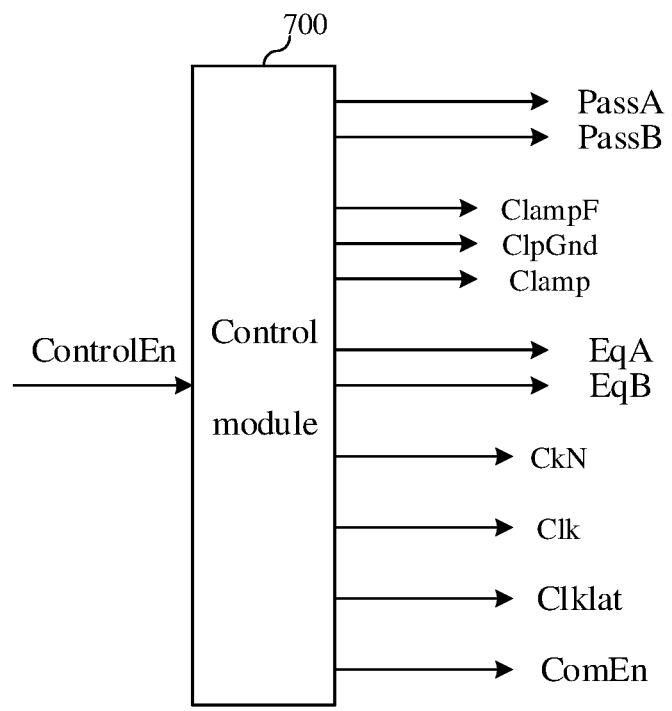
FIG. 5 is a schematic diagram showing control logics of a control module according to an embodiment of the present disclosure.
Figure 6:
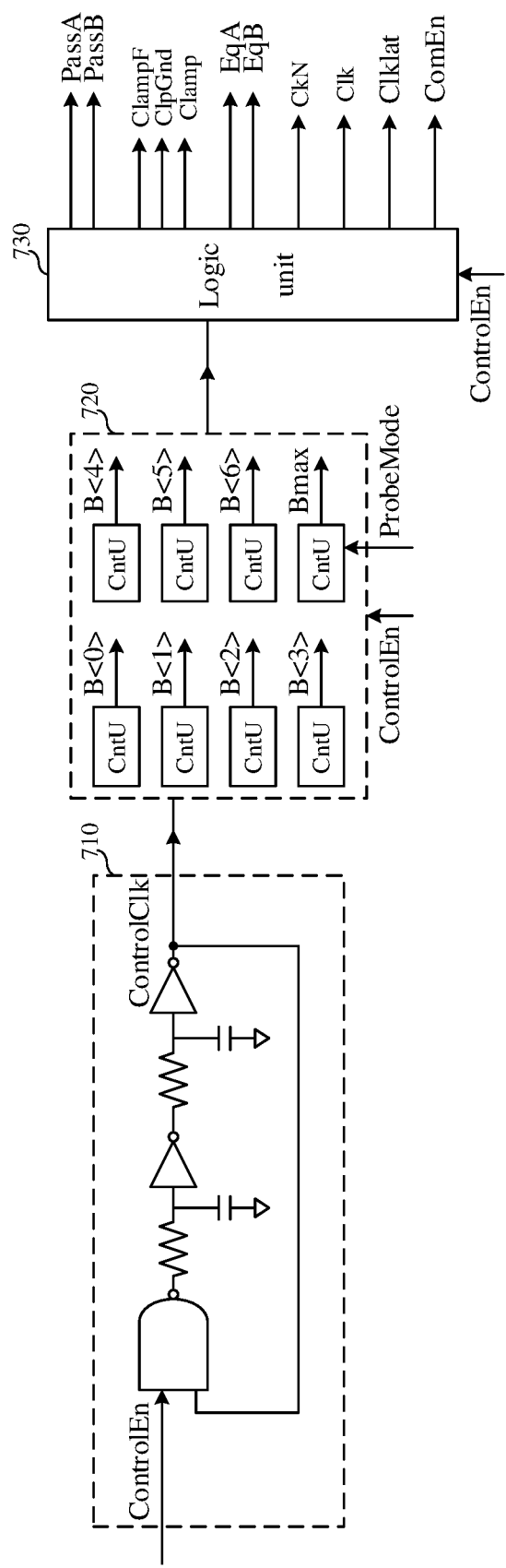
FIG. 6 is a schematic structural diagram of a control module according to an embodiment of the present disclosure.

FIG. 1 is a schematic structural diagram of a test circuit according to an embodiment of the present disclosure. FIG. 2 is a schematic structural diagram of a first integration circuit and a second integration circuit according to an embodiment of the present disclosure. FIG. 3 is a schematic structural diagram of a comparison circuit according to an embodiment of the present disclosure. FIG. 4 is a schematic structural diagram of a pre-storage circuit according to an embodiment of the present disclosure. FIG. 5 is a schematic diagram showing control logics of a control module according to an embodiment of the present disclosure. FIG. 6 is a schematic structural diagram of a control module according to an embodiment of the present disclosure. The test circuit provided by the embodiment is further described in detail with reference to the accompanying drawings.

With reference to FIG. 1, a test circuit 400 configured to test a duty cycle of a signal includes a first integration circuit 401, a second integration circuit 402 and a comparison circuit 403.

The first integration circuit 401 is configured to receive a first test signal Test1 and integrate the first test signal Test1 to output a first integrated signal FltNdT.

The second integration circuit 402 is configured to receive a second test signal Test2 and integrate the second test signal Test2 to output a second integrated signal FltNdC.

The first test signal Test1 and the second test signal Test2 are signals inverted with respect to each other, a voltage value of the first integrated signal FltNdT is a product of a duty cycle of the first test signal Test1 and a voltage amplitude of a power supply, and a voltage value of the second integrated signal FltNdC is a product of a duty cycle of the second test signal Test2 and the voltage amplitude of the power supply.

The comparison circuit 403 has one input terminal connected to the first integration circuit 401, and the other input terminal connected to the second integration circuit 402. The comparison circuit 403 is configured to compare a voltage value of the first integrated signal FltNdT and a voltage value of the second integrated signal FltNdC, output a high-level signal in response to the first integrated signal FltNdT being greater than the second integrated signal FltNdC, and output a low-level signal in response to the second integrated signal FltNdC being greater than the first integrated signal FltNdT.

A value of the first integrated signal FltNdT acquired by integrating the first test signal Test1 by the first integration circuit 401 is positively proportional to the duty cycle of the first test signal Test1. A value of the second integrated signal FltNdC acquired by integrating the second test signal Test2 by the second integration circuit 402 is positively proportional to the duty cycle of the second test signal Test2. The process for testing duty cycle of a signal is simplified by converting the determination of the duty cycle of the signal into the comparison of the values of the integrated signals. Since the first test signal Test1 and the second test signal Test2 are signals inverted with respect to each other, it is accurately determined whether the duty cycle of the signal is greater than 50% by comparing and testing the signals inverted with respect to each other.

Specifically, with reference to FIG. 2, the first integration circuit 401 includes a first filtering unit 501, a first preprocessing unit 510, and a second preprocessing unit 520.

The first filtering unit 501 is configured to integrate a received signal, that is to say, the first filtering unit 501 is configured to integrate the first test signal Test1.

The first preprocessing unit 510 includes a first conduction transistor <DT1>, a first pre-charge P-type transistor <YP1>, and a first pre-charge N-type transistor <YN1>.

The first conduction transistor <DT1> has a drain configured to receive the first test signal Test1, a source connected to an input terminal of the first filtering unit 501, and a gate configured to receive a first switching signal PassA; the first pre-charge P-type transistor <YP1> has a source configured to receive a high level, a drain connected to the input terminal of the first filtering unit 501, and a gate configured to receive an integrated charging signal ClampF; and the first pre-charge N-type transistor <YN1> has a source configured to receive a low level, a drain connected to the input terminal of the first filtering unit 501, and a gate configured to receive the first integrated discharging signal ClpGnd.

Specifically, the first switching signal PassA is configured to enable the first preprocessing unit 510. When the first conduction transistor <DT1> is turned on by the first switching signal PassA, the first filtering unit 501 receives the first test signal Test1 and starts integrating the first test signal Test1. The first pre-charge P-type transistor <YP1> is turned on based on the integrated charging signal ClampF, so that the input terminal of the first filtering unit 501 is indirectly connected to the high level, thereby pulling up the potential of the input terminal of the first filtering unit 501. The first pre-charge N-type transistor <YN1> is turned on based on the first integrated discharging signal ClpGnd, so that the input terminal of the first filtering unit 501 is indirectly connected to a low level, thereby pulling down the potential of the input terminal of the first filtering unit 501.

The second preprocessing unit 520 includes a second conduction transistor <DT2>, a second pre-charge P-type transistor <YP2>, and a second pre-charge N-type transistor <YN2>.

The second conduction transistor <DT2> has a drain connected to an output terminal of the first filtering unit 501, a source configured to output the first integrated signal FltNdT, and a gate configured to receive a second switching signal PassB; the second pre-charge P-type transistor <YP2> has a source configured to receive a high level, a drain connected to the output terminal of the first filtering unit 501, and a gate configured to receive the integrated charging signal ClampF; and the second pre-charge N-type transistor <YN2> has a source configured to receive a low level, a drain connected to the input terminal of the first filtering unit 501, and a gate configured to receive the first integrated discharging signal ClpGnd.

Specifically, the second switching signal PassB is configured to enable the second preprocessing unit 520. When the second conduction transistor <DT2> is turned on by the second switching signal PassB, the first integrated signal FltNdT acquired by the first filtering unit 501 through integration can be output to the comparison circuit 403, the second pre-charge P-type transistor <YP2> is turned on based on the integrated charging signal ClampF, so that the output terminal of the first filtering unit 501 is indirectly connected to a high level, thereby pulling up the potential of the output terminal of the first filtering unit 501. The second pre-charge N-type transistor <YN2> is turned on based on the first integrated discharging signal ClpGnd, so that the output terminal of the first filtering unit 501 is indirectly connected to a low level, thereby in the potential of the output terminal of the first filtering unit 501.

Continuing with reference to FIG. 2, the second integration circuit 402 includes a second filtering unit 502, a third preprocessing unit 530 and a fourth preprocessing unit 540.

The second filtering unit 502 is configured to integrate a received signal, that is to say, the second filtering unit 502 is configured to integrate the second test signal Test2.

The third preprocessing unit 530 includes a third conduction transistor <DT3>, a third pre-charge P-type transistor <YP3>, and a third pre-charge N-type transistor <YN3>.

The third conduction transistor <DT3> has a drain configured to receive the second test signal Test2, a source connected to an input terminal of the second filtering unit 502, and a gate configured to receive a first switching signal PassA; the third pre-charge P-type transistor <YP3> has a source connected to a gate of the third pre-charge P-type transistor <YP3> and configured to receive a high level, a drain connected to the input terminal of the second filtering unit 502; and the third pre-charge N-type transistor <YN3> has a source configured to receive a low level, a drain connected to the input terminal of the second filtering unit 502, and a gate configured to receive a second integrated discharging signal Clamp.

Specifically, the first switching signal PassA is configured to enable the third preprocessing unit 530. When the third conduction transistor <DT3> is turned on by the first switching signal PassA, the second filtering unit 502 receives the second test signal Test2 and starts integrating the second test signal Test2. The gate and source of the third pre-charge P-type transistor <YP3> simultaneously receive a high level, so that the third pre-charge P-type transistor <YP3> is in a cut off state, so as to prevent the potential of the input terminal of the second filtering unit 502 from being pulled up by the high level. The third pre-charge N-type transistor <YN3> is turned on based on the second integrated discharging signal Clamp, so that the input terminal of the second filtering unit 502 is indirectly connected to a low level, thereby pulling down the potential of the output terminal of the second filtering unit 502.

The fourth preprocessing unit 540 includes a fourth conduction transistor <DT3>, a fourth pre-charge P-type transistor <YP4>, and a fourth pre-charge N-type transistor <YN4>.

The fourth conduction transistor <DT3> has a drain connected to an output terminal of the second filtering unit 502, a source configured to output the second integrated signal FltNdC, and a gate configured to receive a second switching signal PassB; the fourth pre-charge P-type transistor <YP4> has a source connected to a gate of the fourth pre-charge P-type transistor <YP4> and configured to receive a high level, and a drain connected to the output terminal of the second filtering unit 502; and the fourth pre-charge N-type transistor <YN4> has a source configured to receive a low level, a drain connected to the output terminal of the second filtering unit 502, and a gate configured to receive the second integrated discharging signal Clamp.

Specifically, the second switching signal PassB is configured to enable the fourth preprocessing unit 540. When the fourth conduction transistor <DT3> is turned on by the second switching signal PassB, the second integrated signal FltNdC acquired by the second filtering unit 502 through integration can be output to the comparison circuit 403. The gate and source of the fourth pre-charge P-type transistor <YP4> simultaneously receive a high level, so that the fourth pre-charge P-type transistor <YP4> is in a cut off state, so as to prevent the potential of the output terminal of the second filtering unit 502 from being pulled up by the high level. The fourth pre-charge N-type transistor <YN4> is turned on based on the second integrated discharging signal Clamp, so that the output terminal of the second filtering unit 502 is indirectly connected to a low level, thereby pulling down the potential of the output terminal of the second filtering unit 502.

Continuing with reference to FIG. 2, in this embodiment, the first filtering unit 501 is arranged using a second-order Resistance-capacitance (RC) filter. Accordingly, the second filtering unit 502 is also arranged using a second-order RC filter.

It is to be noted that in other embodiments, the first filtering unit and the second filtering unit can be simultaneously arranged using first-order RC filters or higher-order RC filters. Accordingly, in some embodiments, the order of the RC filter used in the first filtering unit can be set to be different from the order of the RC filter used in the second filtering unit, and other types of filters may be used by the first filtering unit and the second filtering unit.

In some embodiments, the test circuit 400 further includes a first equalization circuit 521 and a second equalization circuit 522.

The first equalization circuit 521 has one end connected to an input terminal of the first integration circuit 401, and the other end connected to an input terminal of the second integration circuit 402; the first equalization circuit 521 is configured to make, based on a first equalization signal EqA, a voltage of the input terminal of the first integration circuit 401 be identical to a voltage of the input terminal of the second integration circuit 402; the second equalization circuit 522 has one end connected to an output terminal of the first integration circuit 401, and the other end connected to an output terminal of the second integration circuit 402; and the second equalization circuit 522 is configured to make, based on a second equalization signal EqB, an initial voltage of the first integrated signal FltNdT be identical to an initial voltage of the second integrated signal FltNdC.

Specifically, in this embodiment, the first equalization circuit 521 includes a first equalization P-type transistor <EP1> and a first equalization N-type transistor <EN1>. A source of the first equalization P-type transistor <EP1> and a drain of the first equalization N-type transistor <EN1> are coupled to the input terminal of the first integration circuit 401, a drain of the first equalization P-type transistor <EP1> and a source of the first equalization N-type transistor <EN1> are coupled to the input terminal of the second integration circuit 402, and a gate of the first equalization P-type transistor <EP1> and a gate of the first equalization N-type transistor <EN1> are configured to receive the first equalization signal EqA. The second equalization circuit 522 includes a second equalization P-type transistor <EP2> and a second equalization N-type transistor <EN2>, a source of the second equalization P-type transistor <EP2> and a drain of the second equalization N-type transistor <EN2> are coupled to the output terminal of the first integration circuit 401, a drain of the second equalization P-type transistor <EP2> and a source of the second equalization N-type transistor <EN2> are coupled to the output terminal of the second integration circuit 402, and a gate of the second equalization P-type transistor <EP2> and a gate of the second equalization N-type transistor <EN2> are configured to receive the second equalization signal EqB.

In this embodiment, continuing with reference to FIG. 2, one end of the first equalization circuit 521 is connected to the input terminal of the first filtering unit 501 and the other end of the first equalization circuit 521 is connected to the input terminal of the second filtering unit 502. The first equalization circuit 521 is configured to make, based on the first equalization signal EqA, a voltage of the input terminal of the first filtering unit 501 be identical to a voltage of the input terminal of the second filtering unit 502. One end of the second equalization circuit 522 is connected to the drain of the second conduction transistor <DT2>, and the other end of the second equalization circuit 522 is connected to the drain of the fourth conduction transistor <DT4>. The second equalization circuit 522 is configured to make, based on the second equalization signal EqB, an initial voltage of the first integrated signal FltNdT be identical to an initial voltage of the second integrated signal FltNdC.

It is to be noted that, for the first equalization circuit 521 and the second equalization circuit 522, equalization transistors required to be turned on can be set according to the actual requirements of the test circuit after the equalization. For example, in response to the voltages of the input terminals of the first filtering unit 501 and the second filtering unit 502 being required to be at an intermediate level after being equalized by the first equalization circuit 521, the first equalization P-type transistor <EP1> is adopted to equalize the potentials of the input terminals of the first filtering unit 501 and the second filtering unit 502. In response to the voltages of the input terminals of the first filtering unit 501 and the second filtering unit 502 being required to be at a low level after being equalized by the first equalization circuit 521, the first equalization N-type transistor <EN1> is adopted to equalize the potentials of the input terminals of the first filtering unit 501 and the second filtering unit 502. In response to the initial voltages of the first integrated signal FltNdT and the second integrated signal FltNdC being required to be at an intermediate level after being equalized by the second equalization circuit 522, the second equalization P-type transistor <EP2> is adopted to equalize the initial voltages of the first integrated signal FltNdT and the second integrated signal FltNdC. In response to the initial voltages of the first integrated signal FltNdT and the second integrated signal FltNdC being required to be at a low level after being equalized by the second equalization circuit 522, the second equalization N-type transistor <EN2> is adopted to equalize the initial voltages of the first integrated signal FltNdT and the second integrated signal FltNdC.

By equalizing the voltages of the input terminal and the output terminal of the first integration circuit 401 and the voltages of the input terminal and the output terminal of the second integration circuit 402 before the integration performed by the first integration circuit 401 and the second integration circuit 402, the accuracy of a difference between integration values of the second integration circuit 402 and the first integration circuit 401 is ensured, and the accuracy of the duty cycle of the signal acquired subsequently is further ensured. In addition, during the subsequent process of outputting the first integrated signal FltNdT and the second integrated signal FltNdC, the power consumption of the test circuit can be further reduced by turning on the first equalization circuit 521 and the second equalization circuit 522.

With reference to FIG. 3, in this embodiment, the comparison circuit 403 includes a first input P-type transistor <SP1>, a second input P-type transistor <SP2>, third input P-type transistor <SP3>, a first input N-type transistor <SN1>, a second input N-type transistor <SN2>, a third input N-type transistor <SN3>, a fourth input N-type transistor <SN4>, a first comparison P-type transistor <BP1>, a second comparison P-type transistor <BP2>, first comparison N-type transistor <BN1> and second comparison N-type transistor <BN2>.

The first input P-type transistor <SP1> has a gate configured to receive the first integrated signal FltNdT, a source connected to a drain of the third input P-type transistor <SP3>, and a drain connected to a source of the first comparison P-type transistor <BP1>.

The second input P-type transistor <SP2> has a gate configured to receive the second integrated signal FltNdC, a source connected to the drain of the third input P-type transistor <SP3>, and a drain connected to the source of the second comparison P-type transistor <BP2>.

The third input P-type transistor <SP3> has a gate configured to receive a comparison enable signal CkN, and a source configured to receive a high-level signal, that is to say, the third input P-type transistor <SP3> serves as a high-level protection transistor for the comparison circuit 403, and provides a high level required for the operation of the comparison circuit 403 through the comparison enable signal CkN.

The first input N-type transistor <SN1> has a gate configured to receive the comparison enable signal CkN, a source configured to receive a low-level signal, and a drain connected to the source of the first comparison P transistor <BP1>.

The second input N-type transistor <SN2> has a gate configured to receive the comparison enable signal CkN, a source configured to receive a low-level signal, and a drain connected to the source of the second comparison P-type transistor <BP2>.

The third input N-type transistor <SN3> has a gate configured to receive the comparison enable signal CkN, a source configured to receive a low-level signal, and a drain connected to the drain of the first comparison N-type transistor <BN1>.

The fourth input N-type transistor <SN> has a gate configured to receive the comparison enable signal CkN, a source configured to receive a low-level signal, and a source connected to a drain of a second comparison N-type transistor <BN2>.

The first comparison P-type transistor <BP1> has a drain connected to the drain of the first comparison N-type transistor <BN1>, and a gate connected to the drain of the second comparison N-type transistor <BN2>. The second comparison P-type transistor <BP2> has a drain connected to the drain of the second comparison N-type transistor <BN2>, and a gate connected to the drain of the first comparison N-type transistor <BN1>, a source of the first comparison N-type transistor <BN1> is configured to receive the low-level signal, the drain of the first comparison N-type transistor <BN1> is configured to output a first comparison output signal OutP, and a gate of the first comparison N-type transistor <BN1> is connected to the drain of the second comparison N-type transistor <BN2>.

The source of the second comparison N-type transistor <BN2> is configured to receive the low-level signal, the drain of the second comparison N-type transistor <BN2> is configured to output a second comparison output signal OutN, and a gate of the second comparison N-type transistor <BN2> is connected to the drain of the first comparison N-type transistor. One of the first comparison output signal OutP and the second comparison output signal OutN serves as an output signal of the comparison circuit 403 and the other of the first comparison output signal and the second comparison output signal serves as an inverted signal of the output signal.

Specifically, as shown in FIG. 3, the gate of the first input P-type transistor <SP1> is configured to receive the first integrated signal FltNdT, the gate of the second input P-type transistor <SP2> is configured to receive the second integrated signal FltNdC. At this time, the comparison circuit 403 compares a voltage value of the first integrated signal FltNdT and a voltage value of the second integrated signal FltNdC and amplifies a comparison result to generate a first comparison output signal OutP and a second comparison output signal OutN. One of the first comparison output signal OutP or the second comparison output signal OutN is used for representing the comparison result of the first integrated signal FltNdT and the second integrated signal FltNdC, and the other is used as an signal inverted with respect to the signal for representing the comparison result.

It is to be noted that, in this embodiment, the example that the first comparison output signal OutP is used for representing the comparison result of the first integrated signal FltNdT and the second integrated signal FltNdC and the second comparison output signal OutN is used as the signal inverted with respect to the first comparison output signal OutP is taken for detail description, but the example does not constitute a limitation of the embodiment of the present disclosure. In other embodiments, the second comparison output signal may also be used for representing the comparison result of the first integrated signal and the second integrated signal. More specifically, for the first integrated signal FltNdT, in response to the integration value being greater than ½*Vcc (Vcc is the voltage amplitude of the power supply), the corresponding generated first comparison output signal OutP is at a high level; and in response to the integration value being less than ½*Vcc, the corresponding generated first comparison output signal OutP is at a low level.

In some embodiments, with reference to FIG. 4, the test circuit 400 further includes a pre-storage circuit 600 connected to an output terminal of the comparison circuit 403 and configured to receive a first clock signal Clk and a second clock signal Clklat. The pre-storage circuit 600 is configured to pre-store, based on the first clock signal Clk, a level signal output by the comparison circuit 403, or to output a pre-stored level signal based on the second clock signal Clklat.

The pre-storage circuit 600 ensures that the signal output timing of the test circuit 400 is consistent with the signal output timing of the memory to which the test circuit 400 belongs, so as to ensure that the test circuit 400 can be applied to different types of memories.

In this embodiment, with reference FIG. 4, the pre-storage circuit 600 includes a latch 601 and a register 602.

The latch 601 has one end connected to the output terminal of the comparison circuit 403, and the other end configured to receive the first clock signal Clk. The latch 601 is configured to generate, based on an output level of the comparison circuit, an indication signal Result in response to the first clock signal Clk being an effective signal.

Specifically, the latch 601 includes a first latch NAND gate having one input terminal configured to receive a first comparison output signal OutP, and the other input terminal configured to receive a first clock signal Clk; a second latch NAND gate having one input terminal configured to receive a second comparison output signal OutN and the other input terminal configured to receive a first clock signal Clk; a third latch NAND gate having one input terminal connected to the output terminal of the first latch NAND gate and the other input terminal connected to the output terminal of a fourth latch NAND gate; the fourth latch NAND gate having an input terminal connected to the output terminal of the second latch NAND gate, the other input terminal connected to the output terminal of the third latch NAND gate and an output terminal configured to output the indication signal Result.

The register 602 has an input terminal D connected to the output terminal of the latch 601, a clock terminal C configured to receive the second clock signal Clklat, and an enable terminal RN configured to receive the output enable signal ComEn. The register 602 is configured to output an indication signal Result when the second clock signal Clklat and the output enable signal ComEn are effective signals.

It is to be noted that in some embodiments, the register 603 may be arranged using Flip-Flop (FF) Register.

In some embodiments, the test circuit 400 further includes a control module 700. With reference to FIG. 5, the control module 700 is configured to provide, based on a control enable signal ControlEn, control signals required for duty cycle test by the first integration circuit 401, the second integration circuit 402 and the comparison circuit 403.

Specifically, the control signals required for duty cycle test by the first integrating circuit 401, the second integrating circuit 402 and the comparison circuit 403 include: the first equalization signal EqA, the second equalization signal EqB, the integrated charging signal ClampF, the first integrated discharging signal ClpGnd, the second integrated discharging signal Clamp, the first switching signal PassA, the second switching signal PassB, the comparison enable signal CkN, the first clock signal Clk, the second clock signal Clklat and the output enable signal ComEn.

In this embodiment, with reference to FIG. 5, the control module 700 includes a clock unit 710, a timing unit 720 and a logic unit 730.

The clock unit 710 is configured to generate a control clock signal ControlClk based on the control enable signal ControlEn.

The timing unit 720 is connected to an output terminal of the clock unit 710 and stores a signal count value B. The timing unit 720 is configured to control the signal count value B to be incremented by one, in response to the control enable signal ControlEn and the control clock signal ControlClk being effective signals.

The logic unit 730 is connected to an output of the timing unit 720 and stores a control signal corresponding to each signal count value B. The logic unit 730 is configured to provide the control signal corresponding to the signal count value B based on the signal count value B.

Specifically, the clock unit 710 is arranged using a ring oscillator and, the control enable signal ControlEn serves as an enable signal of the ring oscillator. The example that a 7-bit signal is composed of 7 bits is taken for illustrating the signal count value B, and the example does not constitute a limitation to the embodiment of the present disclosure. In actual configuration, the number of bits of the signal count value can be configured according to actual requirements.

In this embodiment, continuing with reference to FIG. 6, the timing unit 720 is also configured to receive a test control signal ProbeMode, and when the test control signal ProbeMode is effective, add at least one newly added data bit Bmax to the signal count value B. The newly added bit Bmax increases the change period of the control clock signal ControlClk by increasing the number of bits of the signal count value B, so that a redundant period is provided for testing the test circuit, so as to effectively detect whether the test circuit has faults and ensure the effective operation of the test circuit.

According to the embodiments of the present disclosure, a value of the first integrated signal FltNdT acquired by integrating the first test signal Test1 by the first integration circuit 401 is positively proportional to the duty cycle of the first test signal Test1. A value of the second integrated signal FltNdC acquired by integrating the second test signal Test2 by the second integration circuit 402 is positively proportional to the duty cycle of the second test signal Test2. The process for testing duty cycle of a signal is simplified by converting the determination of the duty cycle of the signal into the comparison of the values of the integrated signal. Since the first test signal Test1 and the second test signal Test2 are signals inverted with respect to each other, it is accurately determined whether the duty cycle of the signal is greater than 50% by comparing and testing the signals inverted with respect to each other.

It is to be noted that the features disclosed in the test circuit provided by the above embodiments can be arbitrarily combined without conflict, and a new test circuit embodiment can be obtained.

Another embodiment of the present disclosure provides a test method applied to the test circuit provided by the above embodiment, to accurately test the duty cycle of an input signal.

Figure 7:
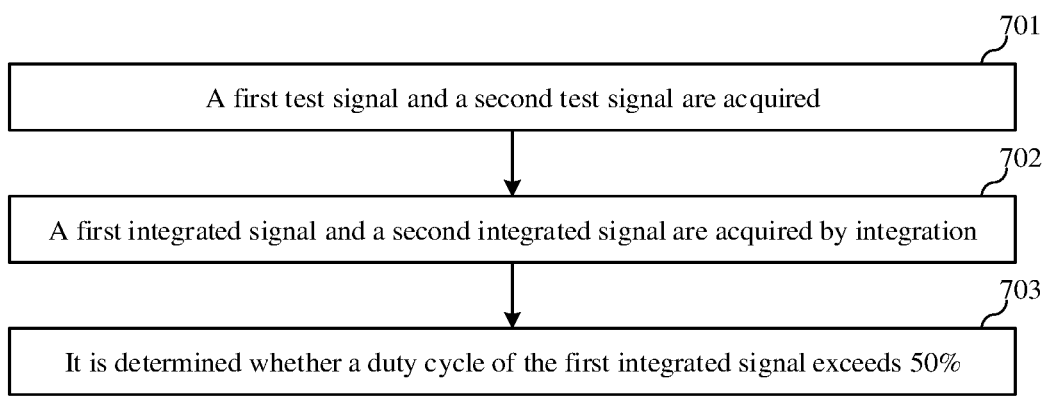
FIG. 7 is a flowchart of a test method according to another embodiment of the present disclosure.
Figure 8:
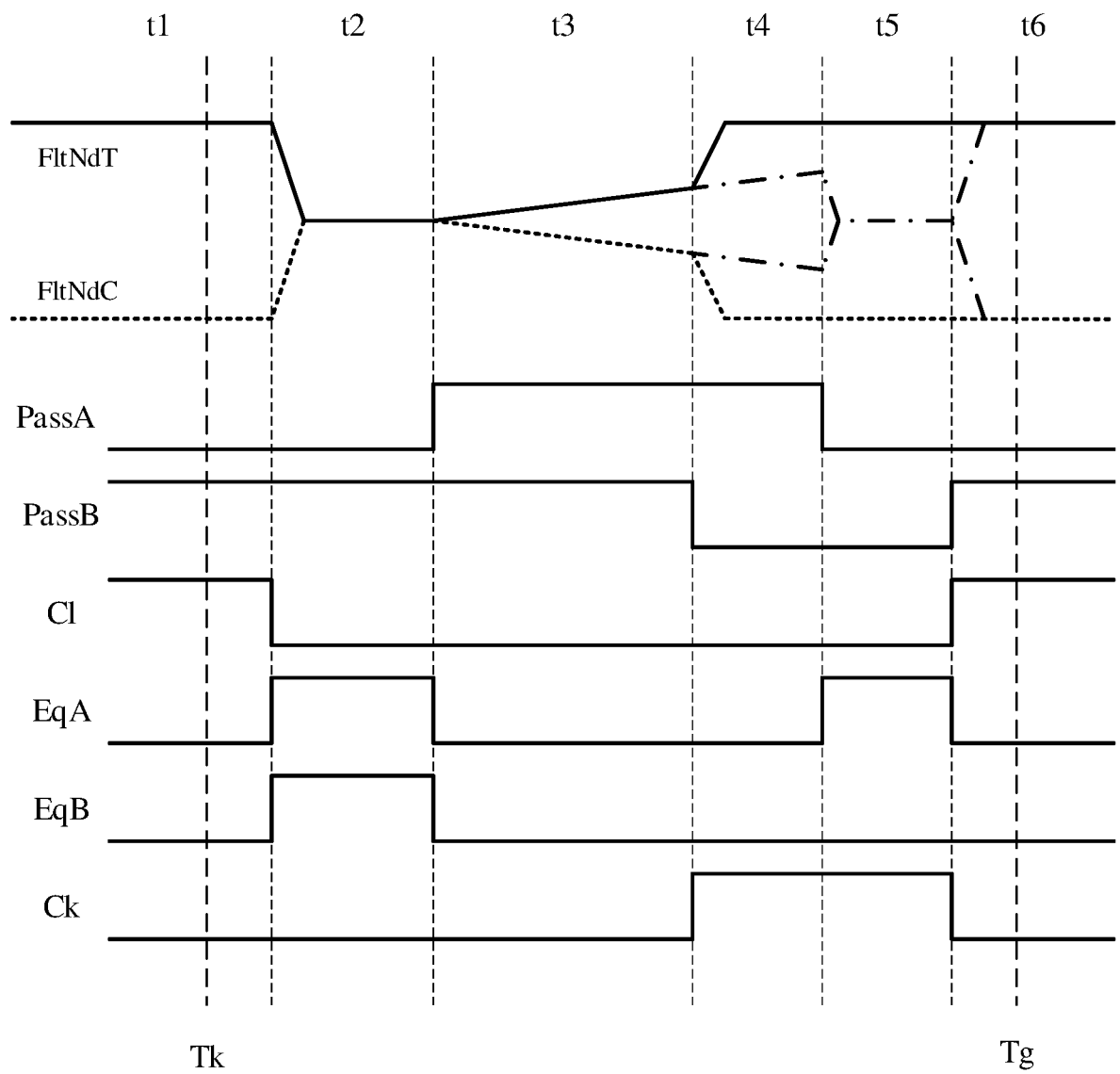
FIG. 8 is a schematic diagram showing a test timing of a test method according to another embodiment of the present disclosure.
Figure 9:
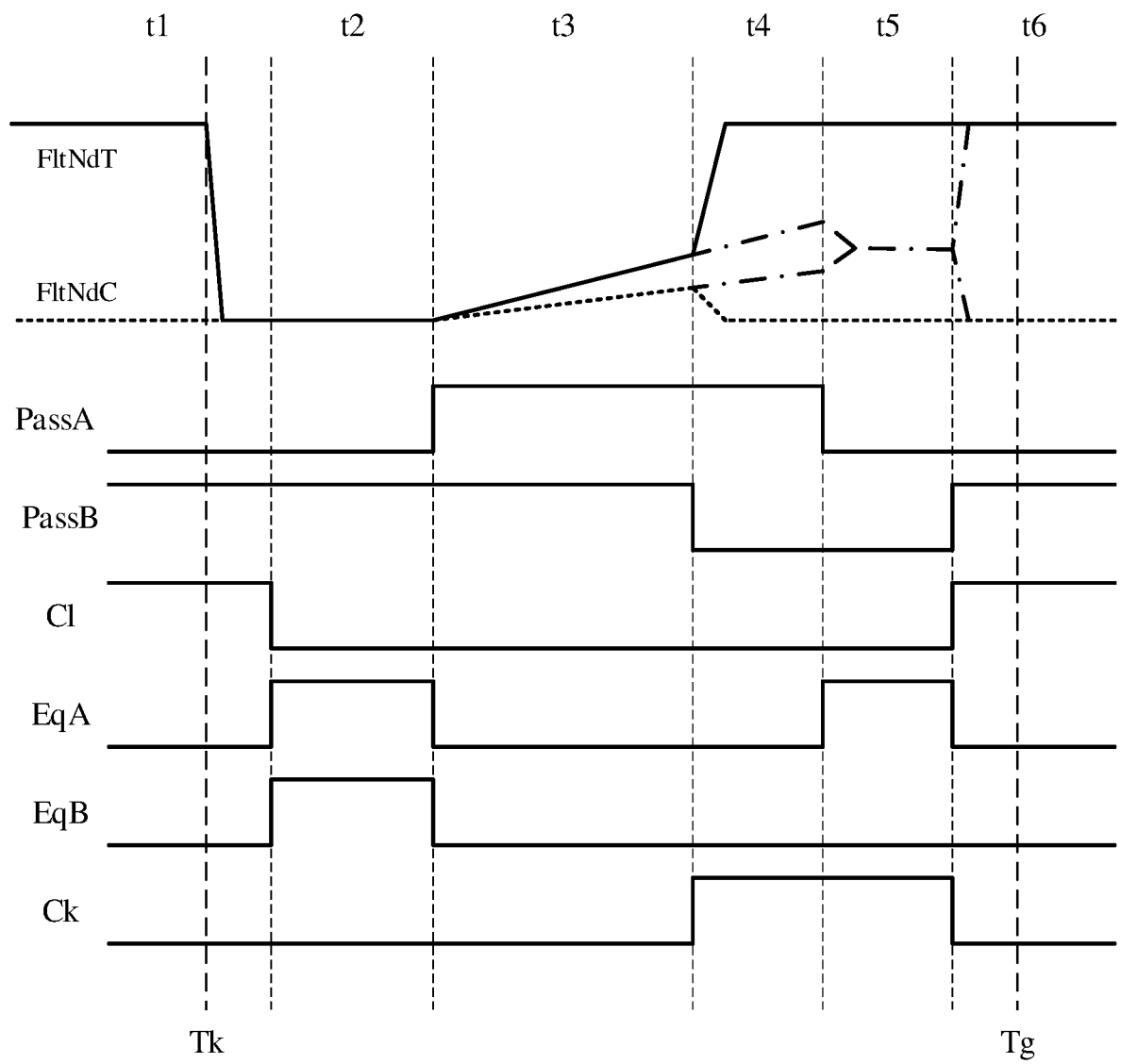
FIG. 9 is a schematic diagram showing a test timing of another test method according to another embodiment of the present disclosure.

FIG. 7 is a flowchart of a test method according to an embodiment of the present disclosure. FIG. 8 is a schematic diagram showing a test timing of a test method according to an embodiment of the present disclosure. FIG. 9 is a schematic diagram showing a test timing of another test method according to an embodiment of the present disclosure. The test method provided by this embodiment is further described in detail with reference to the accompanying drawings.

With reference to FIG. 7, the test method includes operations 701 to 703.

In operation 701, a first test signal and a second test signal are acquired, where the first test signal and the second test signal are signals inverted with respect to each other.

In operation 702, the first integrated signal and the second integrated signal are acquired by integration.

Specifically, the first test signal is integrated based on a first integration circuit to acquire a first integrated signal, and the second test signal is integrated based on a second integration circuit to acquire a second integrated signal. A value of the first integrated signal is a product of a duty cycle of the first test signal and a voltage amplitude of a power supply, and a value of the second integrated signal is a product of a duty cycle of the second test signal and the voltage amplitude of the power supply.

In one specific example, with reference to FIG. 8, operation 702 includes: the first integration circuit is coupled to a power supply node and the second integration circuit is coupled to a ground node; the first integration circuit is decoupled from the power supply node, the second integration circuit is decoupled from the ground node and the first integration circuit is connected to the second integration circuit to perform potential equalization; the first integration circuit is disconnected from the second integration circuit, and the first test signal is provided to the first integration circuit, and the second test signal is provided to the second integration circuit; and the first integrated signal and the second integrated signal are acquired.

Specifically, in stage t1, i.e., the pre-charge stage, the first integration circuit is coupled to the power supply node and the second integration circuit is coupled to the ground node. In the embodiment, by a Cl signal (the Cl signal includes the integrated charging signal ClampF, the first integrated discharging signal ClpGnd, and the second integrated discharging signal Clamp), the first integration circuit is precharged to a high level, and the second integration circuit is precharged to a low level. The dashed line Tk in the stage t1 represents the time node where the test circuit is enabled. In stage t2, i.e. an equalization stage, the first integration circuit is decoupled from the power supply node, and the second integration circuit is decoupled from the ground node, and the first integration circuit is connected to the second integration circuit to perform the potential equalization. In this embodiment, the first integration circuit is connected to the second integration circuit by the first equalization signal EqA and the second equalization signal EqB, and both the potentials of the first integration circuit and the second integration circuit after the equalization are Vcc/2 (Vcc is a voltage supplied at a high level). In stage t3, i.e., integration sampling stage, the first switching signal PassA and the second switching signal PassB are provided, and the first test signal and the second test signal are provided. The first integration circuit integrates the first test signal to acquire the first integrated signal, and the second integration circuit integrates the second test signal to acquire the second integrated signal. In the t4 phase, i.e., the comparison stage, the second switching signal PassB is disabled, as the first switching signal PassA is not disabled, at this time, the first integration circuit and the second integration circuit are still integrating, but, the integration values of the first integration circuit and the second integration circuit no longer affect the input terminal of the comparison circuit. The comparison circuit performs comparison and amplification on the values of the first integrated signal and the second integrated signal when the second equalization signal PassB is disabled, and the comparison result is acquired. In this embodiment, the output comparison result is output to the pre-storage circuit to ensure that the signal output timing of the test circuit is consistent with the signal output timing of the memory to which the test circuit belongs, so as to ensure that the test circuit can be applied to different types of memories. In the stage t5, i.e., the signal output stage, the pre-storage circuit outputs the test result. In stage t6, i.e., recovery stage, the test circuit gets ready for signal test a next time. The dashed line Tg in stage t6 represents the time node where the test circuit is turned off.

In a specific example, with reference to FIG. 9, operation 702 includes: the first integration circuit and the second integration circuit are coupled to the ground node, the first integration circuit is disconnected from the second integration circuit, and the first test signal is provided to the first integration circuit, and the second test signal is provided to the second integration circuit; and the first integrated signal and the second integrated signal are acquired.

Specifically, in a stage t1, i.e., a pre-charge stage, the first integration circuit and second integration circuit are coupled to the ground node, i.e., the first integration circuit and second integration circuit are precharged to a low level by a Cl signal (the Cl signal includes the integrated charging signal ClampF, the first integrated discharging signal ClpGnd, and the second integrated discharging signal Clamp). The dashed line Tk in the stage t1 represents the time node where the test circuit is enabled. In stage t2, i.e., an equalization stage, the first integration circuit and the second integration circuit are decoupled from the ground node, and the first integration circuit is connected to the second integration circuit to perform potential equalization. In this embodiment, the first integration circuit is connected to the second integration circuit by the first equalization signal EqA and the second equalization signal EqB, and both the potentials of the first integration circuit and the second integration circuit after the equalization are Vss (Vss is a voltage supplied at a low level). In stage t3, i.e., an integration sampling stage, the first switching signal PassA and a second switching signal PassB are provided, and the first test signal and the second test signal are provided. The first integration circuit integrates the first test signal to acquire a first integrated signal, and a second integration circuit integrates the second test signal to acquire a second integrated signal. In the phase t4, i.e., a comparison stage, the second switching signal PassB is disabled; as the first switching signal PassA is enabled, at this time, the first integration circuit and the second integration circuit are still integrating, but, the integration values of the first integration circuit and the second integration circuit no longer affect the input terminal of the comparison circuit. The comparison circuit performs comparison and amplification on the values of the first integrated signal and the second integrated signal that are obtained when the second equalization signal PassB is disabled, and obtains a comparison result. In this embodiment, the output comparison result is output to the pre-storage circuit to ensure that the signal output timing of the test circuit is consistent with the signal output timing of the memory to which the test circuit belongs, so as to ensure that the test circuit can be applied to different types of memories. In the stage t5, that is, the signal output stage, pre-store the circuit outputs test results. In stage t6, i.e., a recovery stage where the test circuit gets ready for signal test a next time. The dashed line Tg in stage t6 represents a time node where the test circuit is turned off and stops working.

It is to be noted that embodiments provide two specific comparison manners, the main difference of which is as follow.

One of the two specific comparison manners is used for equalizing both the potentials of the first integration circuit and the second integration circuit to be Vcc/2 (Vcc is a voltage supplied at a high level) through the first equalization signal EqA and the second equalization signal EqB. Both the potentials of the first integration circuit and the second integration circuit are Vcc/2, and the integration values of the first integration circuit and the second integration circuit are identical to the integration value obtained when the duty cycle is 50%. In this way, it is beneficial to improve the test accuracy, and such a comparison manner is suitable for testing a duty cycle of a full swing test signal.

The other one of the two specific comparison manners is used for equalizing the potentials of the first integration circuit and the second integration circuit to a low level through the first equalization signal EqA and the second equalization signal EqB. Both the potentials of the first integration circuit and the second integration circuit are 0, and the corresponding integration value also has value of 0, In this way, it is beneficial to reduce the power consumption of the integration circuit and is suitable for duty cycle test of a low swing test signal.

Continuing with reference to FIG. 7, in operation 703, it is determined whether the duty cycle of the first integrated signal exceeds 50%.

Specifically, a voltage value of the first integrated signal is compared with a voltage value of the second integrated signal by the comparison circuit, and a duty cycle of the first test signal is determined based on an indication signal generated by the comparison circuit.

In response to the indication signal being a high level, the duty cycle of the first test signal is greater than 50%, and in response to the indication signal being a low level, the duty cycle of the first test signal is not greater than 50%.

In some embodiments, with reference to respective stages t5 of FIG. 8 and FIG. 9, the test method further includes: the first integration circuit is connected to the second integration circuit after the process of comparing, based on the comparison circuit, the voltage value of the first integrated signal and the voltage value of the second integrated signal.

Specifically, after the comparison circuit compares the magnitude relationship between the first integrated signal and the second integrated signal, i.e., during the process of outputting the comparison result, the first integration circuit is connected to the second integration circuit to equalize the input voltages of the first integration circuit and the second integration circuit.

It should be noted that the features disclosed in the test method provided by the above embodiments can be arbitrarily combined without conflict, and new test method embodiments can be obtained.

Another embodiment of the present disclosure provides a memory configured to test a duty cycle of a signal based on the test circuit provided in the above embodiments, to accurately test the duty cycle of an input signal.

In some embodiments, the memory is a dynamic random access memory (DRAM) chip, where the memory of the DRAM chip conforms to a memory specification of 2th Double Data Rate (DDR2).

In some embodiments, the memory is a DRAM chip, where the memory of the DRAM chip conforms to a memory specification of DDR3.

In some embodiments, the memory is a DRAM chip, where the memory of the DRAM chip conforms to a memory specification of DDR4.

In some embodiments, the memory is a DRAM chip, where the memory of the DRAM chip conforms to a memory specification of DDR5.

Those of ordinary skill in the art will appreciate that the above-described embodiments are specific embodiments implementing the present disclosure and that in practical application, various changes in form and detail may be made thereto without departing from the spirit and scope of the present disclosure.

The invention claimed is:

1. A test circuit for testing a duty cycle of a signal, comprising:
    a first integration circuit configured to receive a first test signal and integrate the first test signal to output a first integrated signal;
    a second integration circuit configured to receive a second test signal and integrate the second test signal to output a second integrated signal,
    wherein the first test signal and the second test signal are signals inverted with respect to each other, a voltage value of the first integrated signal is a product of a duty cycle of the first test signal and a voltage amplitude of a power supply, and a voltage value of the second integrated signal is a product of a duty cycle of the second test signal and the voltage amplitude of the power supply; and a comparison circuit having one input terminal connected to the first integration circuit, and the other input terminal connected to the second integration circuit, wherein the comparison circuit is configured to compare a voltage value of the first integrated signal and a voltage value of the second integrated signal, output a high-level signal in response to the first integrated signal being greater than the second integrated signal, and output a low-level signal in response to the second integrated signal being greater than the first integrated signal; and wherein the test circuit further comprises; a control module configured to provide, based on a control enable signal, control signals required for duty cycle test by the first integration circuit, the second integration circuit and the comparison circuit.

2. The test circuit of claim 1, wherein the first integration circuit comprises: a first filtering unit, a first preprocessing unit, and a second preprocessing unit, wherein the first filtering unit is configured to integrate a received signal;

the first preprocessing unit comprises:

a first conduction transistor, a first pre-charge P-type transistor and a first pre-charge N-type transistor, wherein the first conduction transistor has a drain configured to receive the first test signal, a source connected to an input terminal of the first filtering unit, and a gate configured to receive a first switching signal; the first pre-charge P-type transistor has a source configured to receive a high level, a drain connected to the input terminal of the first filtering unit, and a gate configured to receive an integrated charging signal; and the first pre-charge N-type transistor has a source configured to receive a low level, a drain connected to the input terminal of the first filtering unit, and a gate configured to receive the first integrated discharging signal; and the second preprocessing unit comprises:

a second conduction transistor, a second pre-charge P-type transistor and a second pre-charge N-type transistor, wherein the second conduction transistor has a drain connected to an output terminal of the first filtering unit, a source configured to output the first integrated signal, and a gate configured to receive a second switching signal; the second pre-charge P-type transistor has a source configured to receive a high level, a drain connected to the output terminal of the first filtering unit, and a gate configured to receive the integrated charging signal; and the second pre-charge N-type transistor has a source configured to receive a low level, a drain connected to the input terminal of the first filtering unit, and a gate configured to receive the first integrated discharging signal.

3. The test circuit of claim 1, wherein the second integration circuit comprises: a second filtering unit, a third preprocessing unit, and a fourth preprocessing unit, wherein the second filtering unit is configured to integrate a received signal;

the third preprocessing unit comprises:

a third conduction transistor, a third pre-charge P-type transistor and a third pre-charge N-type transistor, wherein the third conduction transistor has a drain configured to receive the second test signal, a source connected to an input terminal of the second filtering unit, and a gate configured to receive a first switching signal; the third pre-charge P-type transistor has a source connected to a gate of the third pre-charge P-type transistor and configured to receive a high level, a drain connected to the input terminal of the second filtering unit; and the third pre-charge N-type transistor has a source configured to receive a low level, a drain connected to the input terminal of the second filtering unit, and a gate configured to receive a second integrated discharging signal; and the fourth preprocessing unit comprises:

a fourth conduction transistor, a fourth pre-charge P-type transistor and a fourth pre-charge N-type transistor, wherein the fourth conduction transistor has a drain connected to an output terminal of the second filtering unit, a source configured to output the second integrated signal, and a gate configured to receive a second switching signal; the fourth pre-charge P-type transistor has a source connected to a gate of the fourth pre-charge P-type transistor and configured to receive a high level, and a drain connected to the output terminal of the second filtering unit; and the fourth pre-charge N-type transistor has a source configured to receive a low level, a drain connected to the output terminal of the second filtering unit, and a gate configured to receive the second integrated discharging signal.

4. The test circuit of claim 2, wherein the first filtering unit is arranged using a second-order Resistance-capacitance (RC) filter.

5. The test circuit of claim 2, further comprising: a first equalization circuit and a second equalization circuit, wherein the first equalization circuit has one end connected to an input terminal of the first integration circuit, and the other end connected to an input terminal of the second integration circuit;

the first equalization circuit is configured to make, based on a first equalization signal, a voltage of the input terminal of the first integration circuit be identical to a voltage of the input terminal of the second integration circuit;

the second equalization circuit has one end connected to an output terminal of the first integration circuit, and the other end connected to an output terminal of the second integration circuit; and the second equalization circuit is configured to make, based on a second equalization signal, an initial voltage of the first integrated signal be identical to an initial voltage of the second integrated signal.

6. The test circuit of claim 5, wherein:

the first equalization circuit comprises a first equalization P-type transistor and a first equalization N-type transistor, wherein a source of the first equalization P-type transistor and a drain of the first equalization N-type transistor are coupled to the input terminal of the first integration circuit, a drain of the first equalization P-type transistor and a source of the first equalization N-type transistor are coupled to the input terminal of the second integration circuit, and a gate of the first equalization P-type transistor and a gate of the first equalization N-type transistor are configured to receive the first equalization signal; and the second equalization circuit comprises a second equalization P-type transistor and a second equalization N-type transistor, wherein a source of the second equalization P-type transistor and a drain of the second equalization N-type transistor are coupled to the output terminal of the first integration circuit, a drain of the second equalization P-type transistor and a source of the second equalization N-type transistor are coupled to the output terminal of the second integration circuit, and a gate of the second equalization P-type transistor and a gate of the second equalization N-type transistor are configured to receive the second equalization signal.

7. The test circuit of claim 1, wherein the comparison circuit comprises:
a first input P-type transistor having a gate configured to receive the first integrated signal, a source connected to a drain of a third input P-type transistor, and a drain connected to a source of a first comparison P-type transistor; a second input P-type transistor having a gate configured to receive the second integrated signal, a source connected to the drain of the third input P-type transistor, and a drain connected to a source of a second comparison P-type transistor; and the third input P-type transistor has a gate configured to receive a comparison enable signal and a source configured to receive a high-level signal;
a first input N-type transistor having a gate configured to receive the comparison enable signal, a source configured to receive the low-level signal, and a drain connected to the source of the first comparison P-type transistor; a second input N-type transistor having a gate configured to receive the comparison enable signal, a source configured to receive the low-level signal, and a drain connected to the source of the second comparison P-type transistor;
a third input N-type transistor having a gate configured to receive the comparison enable signal, a source configured to receive the low-level signal, and a drain connected to a drain of a first comparison N-type transistor; and a fourth input N-type transistor having a gate configured to receive the comparison enable signal, a source configured to receive the low-level signal, and a drain connected to a drain of a second comparison N-type transistor,
wherein the first comparison P-type transistor has a drain connected to the drain of the first comparison N-type transistor, and a gate connected to the drain of the second comparison N-type transistor; the second comparison P-type transistor has a drain connected to the drain of the second comparison N-type transistor, and a gate connected to the drain of the first comparison N-type transistor; a source of the first comparison N-type transistor is configured to receive the low-level signal, the drain of the first comparison N-type transistor is configured to output a first comparison output signal, and a gate of the first comparison N-type transistor is connected to the drain of the second comparison N-type transistor; and a source of the second comparison N-type transistor is configured to receive the low-level signal, the drain of the second comparison N-type transistor is configured to output a second comparison output signal, and a gate of the second comparison N-type transistor is connected to the drain of the first comparison N-type transistor,
wherein one of the first comparison output signal and the second comparison output signal serves as an output signal of the comparison circuit, and the other of the first comparison output signal and the second comparison output signal serves as an inverted signal of the output signal.

8. The test circuit of claim 1, further comprising: a pre-storage circuit connected to an output terminal of the comparison circuit and configured to receive a first clock signal and a second clock signal, wherein the pre-storage circuit is configured to pre-store, based on the first clock signal, a level signal output by the comparison circuit, or to output a pre-stored level signal based on the second clock signal.

9. The test circuit of claim 8, wherein the pre-storage circuit comprises:
a latch having one input terminal connected to the output terminal of the comparison circuit, and the other input terminal configured to receive the first clock signal,
wherein the latch is configured to generate, based on an output level of the comparison circuit, an indication signal in response to the first clock signal being an effective signal; and
a register having an input terminal connected to the latch, a clock terminal configured to receive the second clock signal, and an enable terminal configured to receive an output enable signal,
wherein the register is configured to output the indication signal, in response to the second clock signal and the output enable signal being effective signals.

10. The test circuit of claim 1, wherein the control module comprises:
a clock unit configured to generate a control clock signal based on the control enable signal;
a timing unit connected to an output terminal of the clock unit and storing a signal count value, wherein the timing unit is configured to control the signal count value to be incremented by one, in response to the control enable signal and the control clock signal being effective signals; and
a logic unit connected to an output terminal of the timing unit, and storing the control signal corresponding to each signal count value, wherein the logic unit is configured to provide the control signal corresponding to the signal count value based on each signal count value.

11. The test circuit of claim 10, wherein the timing unit is further configured to receive a test control signal, and when the test control signal is effective, add at least one newly added data bit to the signal count value, the newly added data bit being configured to represent whether a memory to which the test circuit belongs is in a test mode.

12. A test method, applied to a test circuit comprising a first integration circuit, a second integration circuit and a comparison circuit, the method comprising:
acquiring a first test signal and a second test signal, wherein the first test signal and the second test signal are signals inverted with respect to each other;
integrating the first test signal based on the first integration circuit to acquire a first integrated signal, and integrating the second test signal based on the second integration circuit to acquire a second integrated signal, wherein a value of the first integrated signal is a product of a duty cycle of the first test signal and a voltage amplitude of a power supply, and a value of the second integrated signal is a product of a duty cycle of the second test signal and the voltage amplitude of the power supply; and
comparing, based on the comparison circuit, a voltage value of the first integrated signal with a voltage value of the second integrated signal, and determining the duty cycle of the first test signal based on an indication signal generated by the comparison circuit, wherein in response to the indication signal being at a high level, the duty cycle of the first test signal is greater than 50%, and in response to the indication signal being at a low level, the duty cycle of the first test signal is not greater than 50%; and wherein after comparing, based on the comparison circuit, the voltage value of the first integrated signal and the voltage value of the second integrated signal, the first integration circuit is connected to the second integration circuit to equalize input voltages of the first integration circuit and the second integration circuit.

13. The test method of claim 12, wherein integrating the first test signal based on the first integration circuit to acquire the first integrated signal, and integrating the second test signal based on the second integration circuit to acquire the second integrated signal comprises:

coupling the first integration circuit to a power supply node and coupling the second integration circuit to a ground node;

decoupling the first integration circuit from the power supply node, and decoupling the second integration circuit from the ground node, and connecting the first integration circuit to the second integration circuit to perform potential equalization;

disconnecting the first integration circuit from the second integration circuit, and providing the first test signal to the first integration circuit, and providing the second test signal to the second integration circuit; and acquiring the first integrated signal and the second integrated signal.

14. The test method of claim 12, wherein integrating the first test signal based on the first integration circuit to acquire the first integrated signal, and integrating the second test signal based on the second integration circuit to acquire the second integrated signal comprises:

coupling the first integration circuit and the second integration circuit to a ground node;

decoupling the first integration circuit and the second integration circuit from the ground node, and connecting the first integration circuit to the second integration circuit to perform potential equalization;

disconnecting the first integration circuit from the second integration circuit, and providing the first test signal to the first integration circuit, and providing the second test signal to the second integration circuit; and acquiring the first integrated signal and the second integrated signal.

15. A memory configured to test a duty cycle of a signal using the test circuit claim 1.

* * * * *